(12) United States Patent
Rosenfeld et al.

(10) Patent No.: US 8,286,694 B2
(45) Date of Patent: *Oct. 16, 2012

(54) CHEMICALLY COMPATIBLE, LIGHTWEIGHT HEAT PIPE

(75) Inventors: John H. Rosenfeld, Lancaster, PA (US); G. Yale Eastman, Lancaster, PA (US)

(73) Assignee: Thermal Corp., Georgetown, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/825,733

(22) Filed: Jun. 29, 2010

(65) Prior Publication Data

US 2010/0263837 A1   Oct. 21, 2010

Related U.S. Application Data

(63) Continuation of application No. 11/363,806, filed on Feb. 28, 2006, now Pat. No. 7,743,502, which is a continuation of application No. 10/643,435, filed on Aug. 19, 2003, now Pat. No. 7,069,978, which is a continuation of application No. 09/753,858, filed on Jan. 3, 2001, now abandoned.

(51) Int. Cl.
*B21D 53/06* (2006.01)
*F28D 15/00* (2006.01)
*H01L 23/36* (2006.01)

(52) U.S. Cl. ......... 165/104.21; 29/890.045; 29/890.032; 165/104.26; 165/905; 257/715; 257/E23.088; 361/700

(58) Field of Classification Search ............. 29/890.032, 29/890.045; 165/104.21, 104.26, 104.33, 165/104.27, 133, 905; 257/715, E23.088; 361/700

See application file for complete search history.

(56) References Cited

U.S. PATENT DOCUMENTS

| | | |
|---|---|---|
| 3,568,723 A | 3/1971 | Sowards |
| 3,672,020 A | 6/1972 | Freggens |
| 3,692,682 A | 9/1972 | Re et al. |
| 3,868,250 A * | 2/1975 | Zimmermann ............... 420/535 |
| 4,018,269 A | 4/1977 | Honda et al. |
| 4,082,575 A | 4/1978 | Eastman |
| 4,101,699 A | 7/1978 | Stine et al. |
| 4,196,504 A | 4/1980 | Eastman |
| 4,197,957 A | 4/1980 | Buhrer |
| 4,292,345 A | 9/1981 | Kolesnik et al. |
| 4,478,275 A * | 10/1984 | Ernst ............................ 165/133 |
| 4,696,455 A | 9/1987 | Johnson |
| 4,703,796 A | 11/1987 | Meijer et al. |
| 4,773,476 A * | 9/1988 | Baehrle et al. ........... 165/104.27 |
| 4,831,965 A | 5/1989 | Brian et al. |
| 4,966,201 A | 10/1990 | Svec et al. |
| 4,969,420 A | 11/1990 | McKeon |
| 4,980,133 A | 12/1990 | Koch |
| 4,991,647 A | 2/1991 | Kawabe et al. |
| 5,004,629 A | 4/1991 | Svec et al. |
| 5,413,642 A * | 5/1995 | Alger ............................ 148/239 |
| 5,599,404 A | 2/1997 | Alger |

(Continued)

FOREIGN PATENT DOCUMENTS

DE        19947730        9/2000

*Primary Examiner* — Alexander P Taousakis
(74) *Attorney, Agent, or Firm* — Michael Best & Friedrich LLP

(57) ABSTRACT

The present invention provides an apparatus including aluminum alloy vessel, the vessel including aluminum in combination with a gettering metal and a method for making such apparatus.

4 Claims, 2 Drawing Sheets

U.S. PATENT DOCUMENTS

| | | |
|---|---|---|
| 5,623,988 A | 4/1997 | Holowczak et al. |
| 5,671,780 A | 9/1997 | Kertesz |
| 5,771,967 A | 6/1998 | Hyman |
| 5,847,925 A * | 12/1998 | Progl et al. ............... 361/679.47 |
| 5,855,828 A | 1/1999 | Tuffias et al. |
| 6,026,569 A | 2/2000 | Evans et al. |
| 6,082,443 A | 7/2000 | Yamamoto et al. |
| 6,143,428 A | 11/2000 | Bommer et al. |
| 6,193,817 B1 * | 2/2001 | King et al. .................... 148/420 |
| 6,263,959 B1 | 7/2001 | Ikeda et al. |
| 6,269,866 B1 | 8/2001 | Yamamoto et al. |
| 6,896,039 B2 | 5/2005 | Dussinger et al. |
| 6,911,231 B2 | 6/2005 | Qu |
| 7,069,978 B2 | 7/2006 | Rosenfeld et al. |
| 7,743,502 B2 * | 6/2010 | Rosenfeld et al. ....... 29/890.032 |
| 2002/0084061 A1 | 7/2002 | Rosenfeld et al. |

* cited by examiner

CHEMICALLY COMPATIBLE, LIGHTWEIGHT HEAT PIPE

CROSS-REFERENCE TO RELATED APPLICATIONS

This application is a continuation of copending U.S. application Ser. No. 11/363,806, filed on Feb. 28, 2006, which is a continuation of U.S. application Ser. No. 10/643,435, filed on Aug. 19, 2003, now U.S. Pat. No. 7,069,978, issued on Jul. 4, 2006, which is a continuation of U.S. application Ser. No. 09/753,858, filed on Jan. 3, 2001, now abandoned, the disclosures of each of which are incorporated by reference herein in their entireties. Priority to each application is hereby claimed.

BACKGROUND OF THE INVENTION

A heat pipe is essentially a passive heat transfer device with an extremely high effective thermal conductivity. A two-phase heat transfer mechanism results in heat transfer capabilities from one hundred to several thousand times that of an equivalent piece of copper. Heat pipes are sealed vacuum vessels that are partially filled with a fluid, typically water in electronic cooling applications, which serves as the heat transfer medium. The heat pipe envelope is typically made of cylindrical copper tubing, although rectangular cross sections and other materials are available. The wall of the envelope is lined with a wick structure, which generates the capillary force that pulls the condensate from the condenser section of the heat pipe back to the evaporator section. Since the heat pipe is evacuated and then charged with the working fluid prior to being sealed, the internal pressure is set by the vapor pressure of the working fluid. As heat is applied to a portion of the surface of the heat pipe, the working fluid is vaporized. The vapor at the evaporator section is at a slightly higher temperature and pressure than other areas and creates a pressure gradient that forces the vapor to flow to the cooler regions of the heat pipe. As the vapor condenses on the heat pipe walls, the latent heat of vaporization is transferred to the condenser. The capillary wick then transports the condensate back to the evaporator section. This is a closed loop process that continues as long as the heat is applied.

The orientation and layout of a heat pipe design are important. When the design allows, the heat source should be located below or at the same elevation as the cooling section for best performance. This orientation allows gravity to aid the capillary action, and results in a greater heat carrying capability. If this orientation is unacceptable, then a capillary wick structure such as sintered powder will be necessary. Additionally, heat pipes have the ability to adhere to the physical constraints of the system, and can be bent around obstructions.

There is a recurring need for heat pipes having low mass. There has been an extended effort to devise a method for using aluminum as the envelope and wick material. Much of this effort has been to use water as the preferred working fluid. Previous efforts have been focused on taking advantage of the fact that aluminum oxide is compatible with water, even though aluminum metal is not compatible. The programs have not been successful because of the large difference in thermal expansion between aluminum and its oxide. The resulting stresses cause the oxide layer to crack, often on the first thermal cycle, thereby allowing the water and aluminum to come into contact, resulting in hydrogen generation and heat pipe failure.

The present invention takes advantage of the stabilizing effects of the "getter" type materials, such as zirconium when added to light metals such as magnesium or aluminum. The addition of zirconium to the magnesium provides a more stable oxide and/or nitride, and provides a water-compatible surface. The fact that this alloy is also lighter than aluminum is an added benefit. The reduced thermal stresses which result with this alloy most likely allow the oxide/nitride to maintain its integrity.

Most commercially available magnesium alloys have significant amounts of aluminum, rare earths, and/or zinc as constituents. None of these materials are readily compatible with water. Therefore, an additional objective of the present invention is to specify a water-compatible alloy of magnesium which does not have these non-compatible constituents.

SUMMARY OF THE INVENTION

The present invention is directed to an improvement in heat transfer vessels as used in weight-sensitive applications, e.g., laptop computers, these vessels composed of magnesium and substantially free of aluminum and zinc, these vessels further having a hollow interior cavity containing a working fluid. The improvement comprises the formation of a stable, protective layer on the inside wall of the vessel, the layer establishing compatibility with the working fluid, and preventing base metal corrosion by the working fluid. In a preferred embodiment of the present invention, an alloy with no aluminum or zinc, but with 0.5 to 1 percent (by weight) zirconium, was used. The zirconium oxide helps provide compatibility with water by stabilizing the oxide surface layer in the presence of water, and similarly provides a stabilizing nitride surface in the presence of ammonia.

BRIEF DESCRIPTION OF THE DRAWINGS

These and other features and advantages of the present invention will be more fully disclosed in, or rendered obvious by, the following detailed description of the preferred embodiments of the invention, which are considered together with the accompanying drawings wherein like numbers refer to like parts and further wherein.

DETAILED DESCRIPTION OF THE INVENTION

Figure 1:
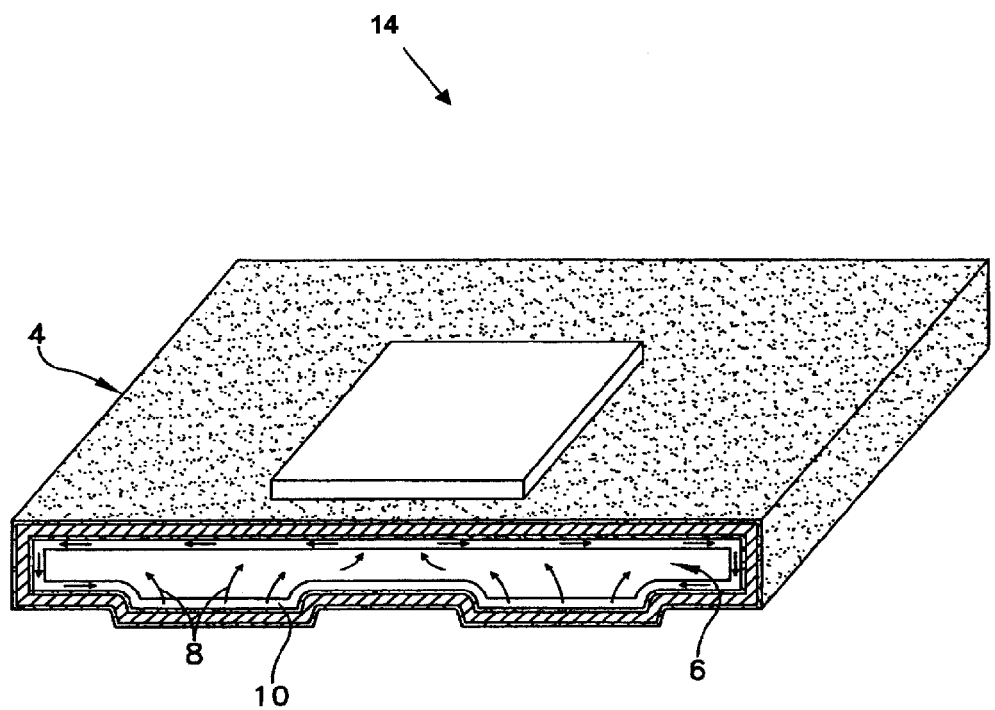
FIG. 1 is a perspective view of a heat pipe formed in accordance with the present invention.
Figure 2:
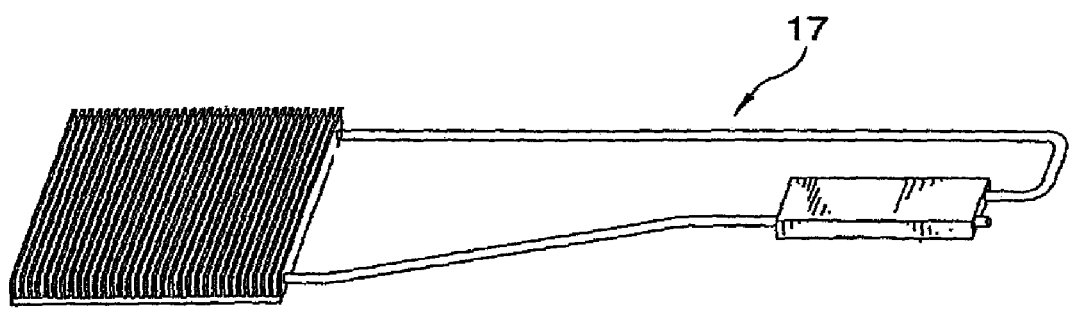
FIG. 2 is a perspective view of a pumped-looped system formed in accordance with the present invention.

The present invention is directed to an improvement in vessels 4 composed of magnesium and substantially free of aluminum and zinc, these vessels 4 having a hollow interior cavity 6 containing a working fluid 8. The stable protective layer 10 will be either an oxide or nitride layer depending on the working fluid 8. For instance, if ammonia is chosen as the working fluid 8, a stable nitride would be formed; in contrast, if water is used as the working fluid 8, a stable oxide would be formed. The preferred vessel 4 for purposes of the present invention is a heat pipe 14, although it is anticipated that other suitable vessels would benefit from the purposes of the present invention as well. Suitable vessels include heat pipe 14 and/or a pumped-looped system 17 (FIGS. 1 and 2).

In a further preferred embodiment of the present invention, the magnesium alloy contains 0.1 to 5 percent of a "gettering" metal or metals e.g., zirconium, titanium, hafnium, yttrium, etc. Amounts of gettering metal of from about 0.1 to 2 percent are preferred, with an amount of about 1% gettering metal, e.g., zirconium, particularly preferred.

A further benefit of the treatment of the present invention can be the strengthening of the primary metal (e.g., magnesium) with alloying materials in excess of the metal's natural solubility. This results in the dispersal of unalloyed particles in grain boundaries, thereby providing a further strengthening effect.

In the testing of the present invention, there have been more than 30 on/off thermal cycles where a Mg/water heat pipe 14 was heated to between 100 to 120° C., and then cooled to room temperature. Note that 1 to 2 of those cycles are normally enough to cause failure in an aluminum/water heat pipe 14. It has been found that there is no degradation in magnesium heat pipes 14. In further testing with more than 50 thermal cycles of a magnesium heat pipe 14 with 0.6 wt % zirconium, no degradation or failure has been observed. Also note that the temperature for fluids within the vessel range from about room temperature (for ammonia) to up to 100° C. (for water).

It is anticipated that the process of the present invention would be effective with aluminum as well. Note that for both aluminum and magnesium systems, the addition of other "getter" alloying metals such as titanium, hafnium and yttrium may also be included in order to increase alloy strength and improve corrosion resistance. The alloys of the present invention are compatible with chemical acids, e.g., water, methanol and other alcohol fluids, as well as chemical bases such as ammonia, pyridine, hydrazine, etc.

While the above description constitutes the preferred embodiments of the present invention, it will be appreciated that the invention is susceptible to modification, variation and change without departing from the proper scope and fair meaning of the accompanying claims.

What is claimed is:

1. A heat transfer device comprising:
   a vessel made from an aluminum alloy that includes a getter metal;
   the vessel having a hollow interior cavity;
   a working fluid is contained in the interior cavity, wherein a stable protective layer is formed from the getter metal and the working fluid on an inside wall of the cavity and wherein water is charged into the hollow interior cavity as the working fluid.

2. The heat transfer device of claim 1 wherein the getter metal is selected from the group consisting of zirconium, titanium, hafnium and yttrium.

3. A heat transfer device comprising:
   a vessel made from an aluminum alloy that includes a getter metal;
   the vessel having a hollow interior cavity;
   a working fluid is contained in the interior cavity, wherein a stable protective layer is formed from the getter metal and the working fluid on an inside wall of the cavity; and wherein ammonia is charged into the hollow interior cavity as the working fluid.

4. The heat transfer device of claim 3, wherein the getter metal is selected from the group consisting of zirconium, titanium, hafnium and yttrium.

\* \* \* \* \*